(12) United States Patent
Hung et al.

(10) Patent No.: US 9,064,931 B2
(45) Date of Patent: Jun. 23, 2015

(54) SEMICONDUCTOR STRUCTURE HAVING CONTACT PLUG AND METAL GATE TRANSISTOR AND METHOD OF MAKING THE SAME

(71) Applicant: UNITED MICROELECTRONICS CORP., Hsin-Chu (TW)

(72) Inventors: Ching-Wen Hung, Tainan (TW);
Chih-Sen Huang, Tainan (TW);
Po-Chao Tsao, New Taipei (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 20 days.

(21) Appl. No.: 13/649,126

(22) Filed: Oct. 11, 2012

(65) Prior Publication Data

US 2014/0103402 A1    Apr. 17, 2014

(51) Int. Cl.
| H01L 23/48 | (2006.01) |
| H01L 23/52 | (2006.01) |
| H01L 29/40 | (2006.01) |
| H01L 21/768 | (2006.01) |
| H01L 23/485 | (2006.01) |
| H01L 29/66 | (2006.01) |
| H01L 29/78 | (2006.01) |

(52) U.S. Cl.
CPC ........ *H01L 21/76816* (2013.01); *H01L 23/485* (2013.01); *H01L 21/76807* (2013.01); *H01L 29/66545* (2013.01); *H01L 29/66628* (2013.01); *H01L 29/66636* (2013.01); *H01L 29/7848* (2013.01); *H01L 2924/0002* (2013.01)

(58) Field of Classification Search
USPC .......... 257/E21.579, 774, 775, 202, 288, 365, 257/776, 751, 752, 753; 438/FOR. 424, 438/637, 638, 639, 640, 672, 673, 675, 197, 438/622, 629, 630
See application file for complete search history.

(56) References Cited

U.S. PATENT DOCUMENTS

| 5,998,873 | A | 12/1999 | Blair |
| 6,124,189 | A * | 9/2000 | Watanabe et al. ............. 438/586 |
| 6,855,607 | B2 | 2/2005 | Achuthan |
| 7,013,446 | B2 | 3/2006 | Ohba |
| 7,112,495 | B2 | 9/2006 | Ko |
| 7,214,620 | B2 | 5/2007 | Kim |
| 7,250,658 | B2 | 7/2007 | Doris |
| 7,521,324 | B2 | 4/2009 | Ohmi |
| 7,531,437 | B2 | 5/2009 | Brask |
| 7,592,270 | B2 | 9/2009 | Teo |
| 7,694,413 | B2 | 4/2010 | Johnston |
| 7,768,074 | B2 | 8/2010 | Golonzka |
| 2002/0121699 | A1* | 9/2002 | Cheng et al. ................. 257/758 |
| 2007/0015365 | A1 | 1/2007 | Chen |
| 2007/0072376 | A1 | 3/2007 | Chen |

(Continued)

*Primary Examiner* — Thanh Y Tran
(74) *Attorney, Agent, or Firm* — Winston Hsu; Scott Margo

(57) ABSTRACT

The present invention provides a semiconductor structure including at least a contact plug. The structure includes a substrate, a transistor, a first ILD layer, a second ILD layer and a first contact plug. The transistor is disposed on the substrate and includes a gate and a source/drain region. The first ILD layer is disposed on the transistor and levels with a top surface of the gate. The second ILD layer is disposed on the first ILD layer. The first contact plug is disposed in the first ILD layer and the second ILD layer and includes a first trench portion and a first via portion, wherein a boundary of the first trench portion and a first via portion is higher than the top surface of the gate. The present invention further provides a method of making the same.

20 Claims, 6 Drawing Sheets

(56) References Cited

U.S. PATENT DOCUMENTS

| | | |
|---|---|---|
| 2007/0218661 A1 | 9/2007 | Shroff |
| 2007/0257323 A1* | 11/2007 | Tsui et al. ............ 257/382 |
| 2007/0264824 A1* | 11/2007 | Siew et al. ........... 438/672 |
| 2008/0061366 A1 | 3/2008 | Liu |
| 2009/0057759 A1 | 3/2009 | Obradovic |
| 2009/0124097 A1 | 5/2009 | Cheng |
| 2009/0200494 A1 | 8/2009 | Hatem |
| 2010/0040768 A1 | 2/2010 | Dhindsa |
| 2010/0044783 A1 | 2/2010 | Chuang |
| 2010/0048027 A1 | 2/2010 | Cheng |
| 2010/0129994 A1 | 5/2010 | Awad |
| 2011/0062502 A1* | 3/2011 | Yin et al. ............ 257/288 |
| 2012/0104471 A1* | 5/2012 | Chang et al. ........ 257/288 |

* cited by examiner

SEMICONDUCTOR STRUCTURE HAVING CONTACT PLUG AND METAL GATE TRANSISTOR AND METHOD OF MAKING THE SAME

BACKGROUND OF THE INVENTION

1. Field of the Invention

The present invention relates to a semiconductor structure having at least a contact plug, and a method of making the same, and more particularly, to a semiconductor structure having at least a contact plug which is formed by a dual damascene process, and a method of making the same.

2. Description of the Prior Art

Poly-silicon is conventionally used as a gate electrode in semiconductor devices, such as the metal-oxide-semiconductor (MOS). However, with a trend toward scaling down the size of semiconductor devices, the conventional poly-silicon gate has faced problems such as inferior performance due to boron penetration and unavoidable depletion effect which increases equivalent thickness of the gate dielectric layer, reduces gate capacitance, and worsens a driving force of the devices. Therefore, work function metals are used to replace the conventional poly-silicon gate to be the control electrode that are suitable for use as the high-k gate dielectric layer.

In addition, in conventional arts, after forming the transistor with a metal gate, a wiring system is formed thereabove to electrically connect the metal gate and the source/drain, thereby providing a signal input/output pathway for the transistor. However, the wiring system connecting the source/drain in conventional arts usually includes a plurality of contacts plugs, resulting in a problem of high resistance and low electrical performance. Furthermore, as the miniaturization of the devices, a problem of electrical short between the metal gate and the contact plug connecting the source/drain is easy to occur and the quality of the device is decreased as well. Consequently, there is still a need for a novel semiconductor structure having at least a contact plug to resolve the above-mentioned problem.

SUMMARY OF THE INVENTION

The present invention therefore provides a semiconductor structure having at least a contact plug and a method of making the same, which is able to improve the overall electrical performance of the devices.

According to one embodiment, the present invention provides a semiconductor structure including a contact plug. The structure includes a substrate, a transistor, a first ILD layer, a second ILD layer and a first contact plug. The transistor is disposed on the substrate and includes a gate and a source/drain region. The first ILD layer is disposed on the transistor and level with a top surface of the gate. The second ILD layer is disposed on the first ILD layer. The first contact plug is disposed in the first ILD layer and the second ILD layer and includes a first trench portion and a first via portion, wherein a boundary of the first trench portion and a first via portion is higher than the top surface of the gate. The present invention further provides a method of making the same.

According to another embodiment, the present invention provides a method of forming a semiconductor structure including at least a contact plug. A substrate is provided, and a transistor and a first ILD layer is formed thereon, wherein the first ILD layer is leveled with a top surface of the gate thereto expose the gate. A second ILD layer is then formed on the first ILD layer. Lastly, a first contact plug is formed in the first ILD layer and the second ILD layer to electrically connect a source/drain of the transistor. The first contact plug is formed by a first dual damascene process.

By using the dual damascene process to form the first contact plug, it is advantageous that the short phenomenon between the first contact plug and the metal gate can be avoided, and the electrical performance can also be improved because only one single barrier layer is used in the first contact plug. In addition, the resistance value of the first contact plug and the second contact plug can also be reduced by using copper or tungsten as the material of metal layer.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
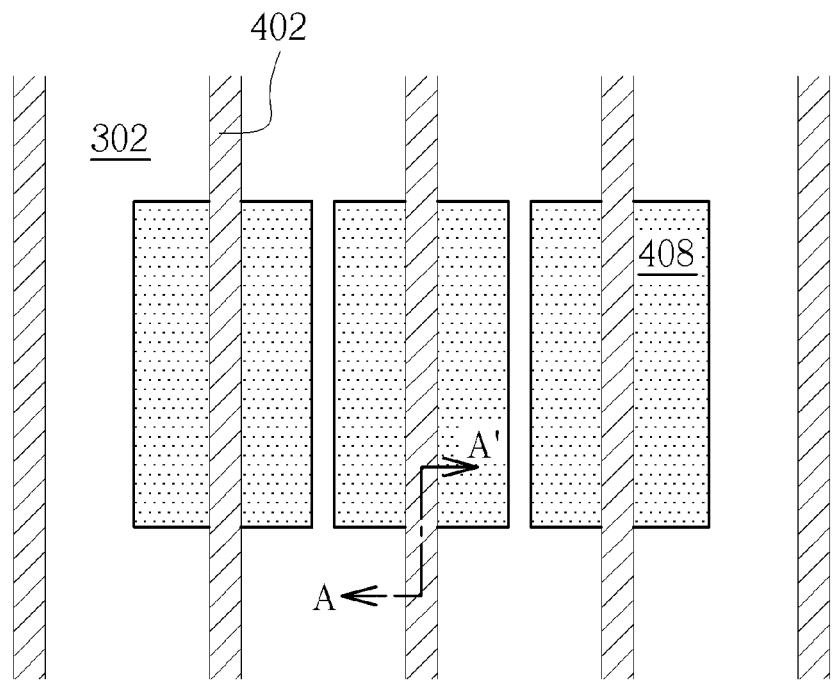
"FIG. 1 to FIG. 11 show schematic diagrams of the method of forming the semiconductor structure having at least a contact plug in the present invention."
Figure 2:
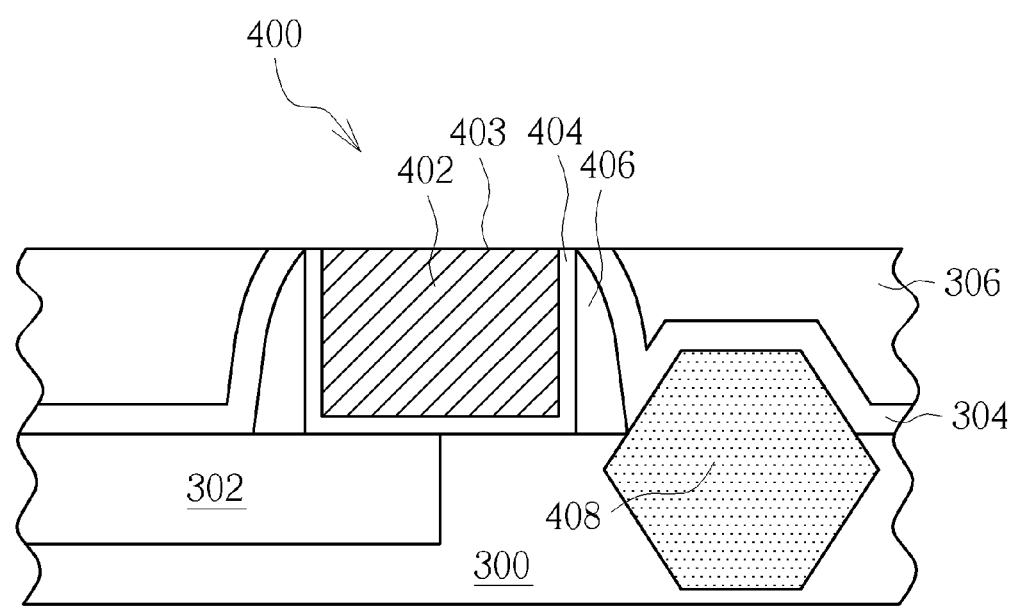
Figure 7:
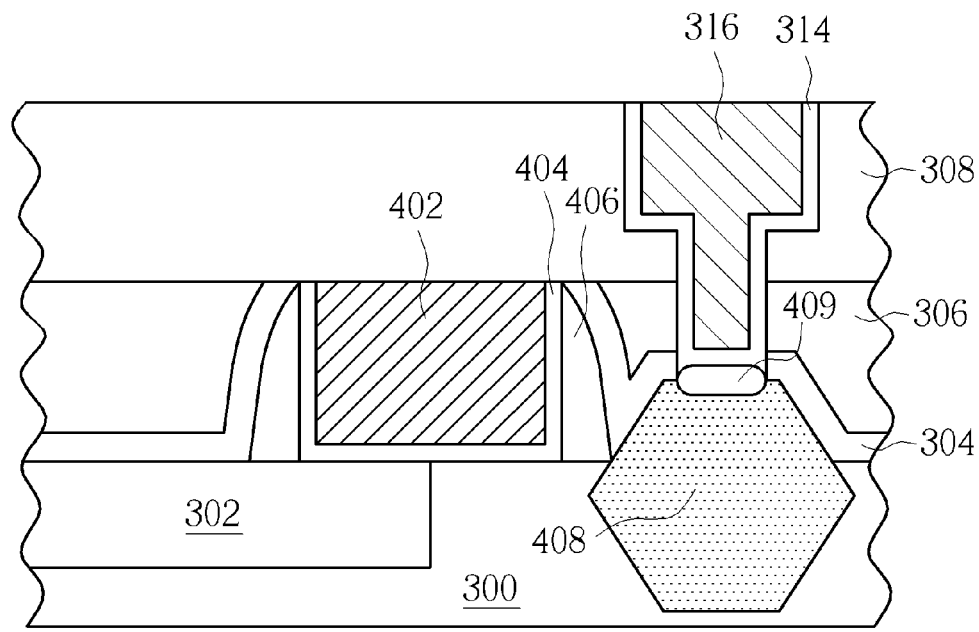
Figure 8:
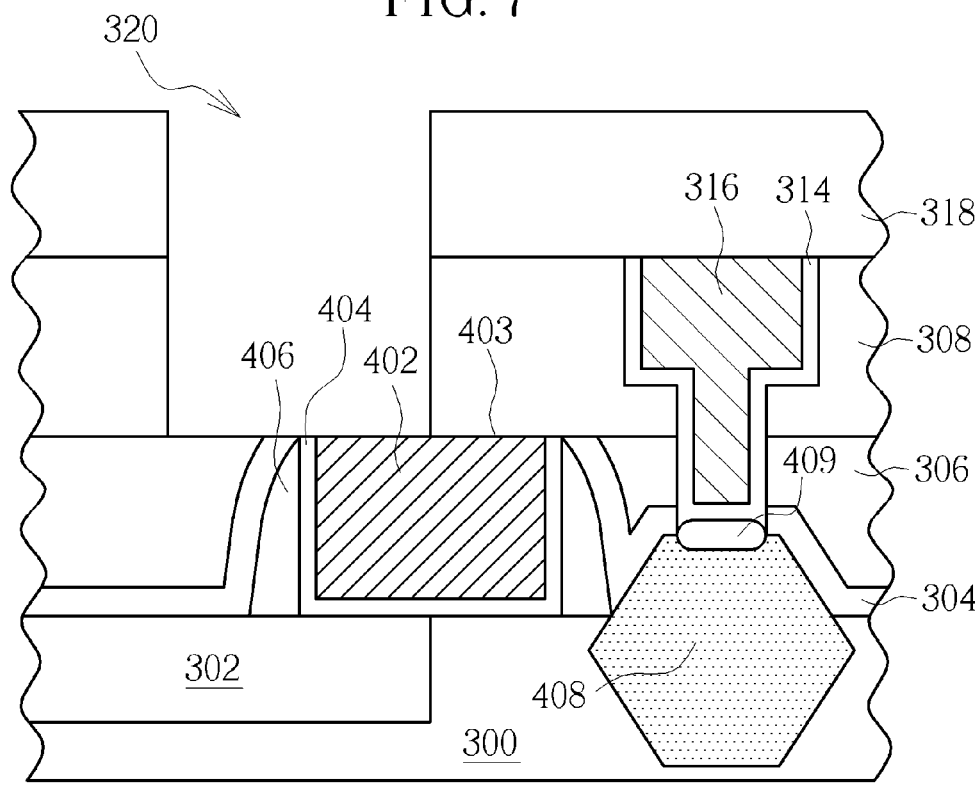
Figure 9:
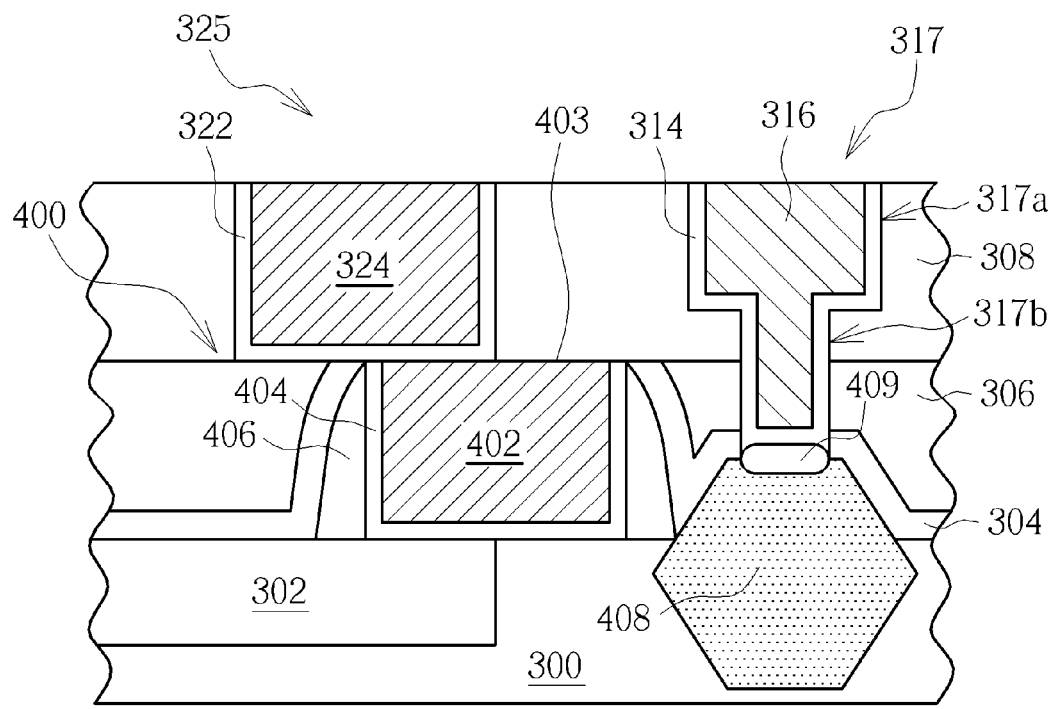
Figure 10:
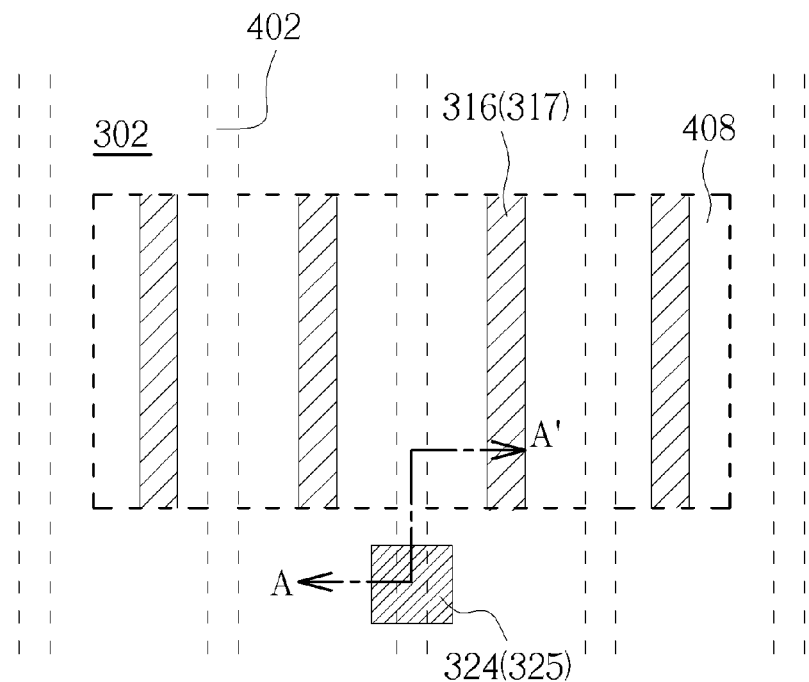

Please refer to FIG. 1 to FIG. 10, which show schematic diagrams of the method of forming a semiconductor structure having at least a contact plug in the present invention, wherein FIG. 2 is a cross sectional view taken along line AA' of FIG. 1 and FIG. 9 is a cross sectional view taken along line AA' of FIG. 10. As shown in FIG. 1 and FIG. 2, a substrate 300 is provided, and a plurality of shallow trench isolations (STI) 302 are formed on substrate 300. The substrate 300 can be a silicon substrate, an epitaxial silicon substrate, a silicon germanium substrate, a silicon carbide substrate or a silicon-on-insulator (SOI) substrate, but is not limited thereto. A transistor 400 is then formed on the substrate 300. The transistor 400 includes a gate 402 and a source/drain region 408. In one preferred embodiment of the present invention, the transistor 400 is formed by a "gate last" semiconductor manufacturing process and includes a metal gate 402. For example, a dummy gate (not shown) is formed on the substrate 300, and then a spacer 406, a source/drain region 408, a contact etch stop layer (CESL) 304 and a first inter-layer dielectric (ILD) layer 306 are sequentially formed on the substrate 300. Next, the dummy gate is removed to form a trench (not shown), which is subsequently filled with a gate dielectric layer 404 and a gate 402. A planarization process is further performed to make a top surface 403 of the gate 402 level with the first ILD layer 306. In one embodiment, as shown in FIG. 2, the gate dielectric layer 404 has a "U-shaped" cross section and the material thereof include $SiO_2$ or high-k materials. The gate 402 can contain one or a plurality of metal layers, for example, a work function metal layer, a barrier layer and a low-resistance metal layer.

Figure 3:
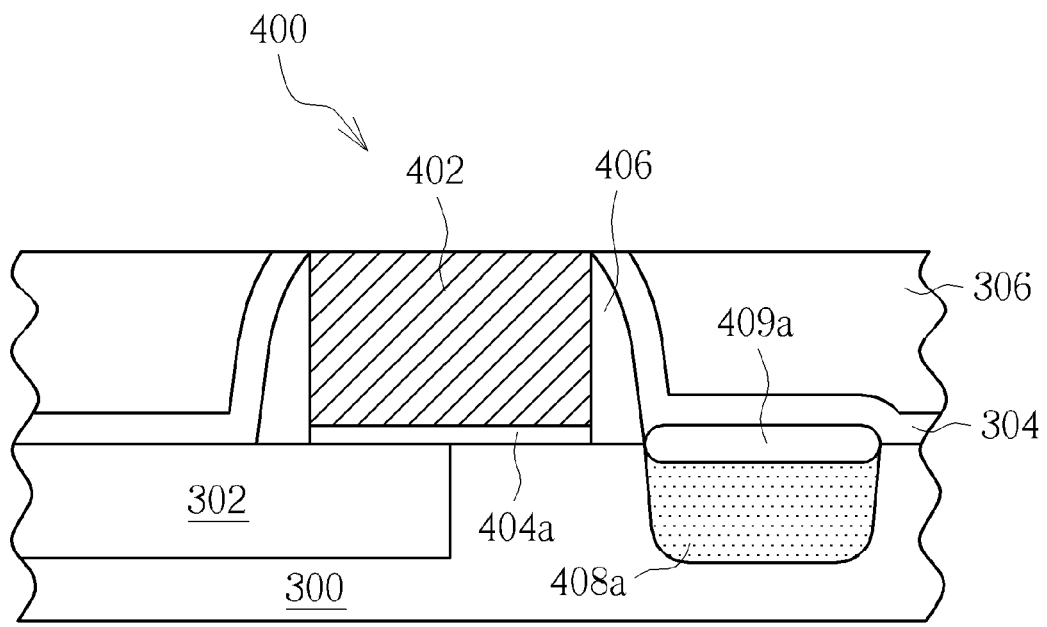

It is worth noting that each component of the transistor 400 can have different embodiments according to different designs of the devices. For example, as shown in FIG. 2, the source/drain region 408 can contain a SiGe layer for PMOS or a SiC layer for NMOS, which is formed by a selective epitaxial growth (SEG) process. In one embodiment, the epitaxial layer has a hexagonal (also called "sigma $\Sigma$") or an octagonal cross section, in which a flat bottom surface of the epitaxial layer is disposed in the substrate 300. In another embodiment, the epitaxial layer extends under the spacer 406 to further enhance the stress effect. In another embodiment, the CESL 304 can provide a stress so as to form a selective strain scheme (SSS). In another embodiment, as shown in FIG. 3, the gate dielectric layer 404a is formed by a "high-k first" process (that is, the gate dielectric layer is formed before the dummy gate) and therefore has a "—" shape in its cross section, which is different from the "U" shape in the embodiment in FIG. 2, that is formed by a "high-k last" process (that is, the gate dielectric layer is formed after removing the dummy gate). In another embodiment, a silicide layer 409a can be formed on the source/drain region 408a. The above embodiments are only shown for example. The transistor 400 in the present invention can have a variety of embodiments, which are not described for the sake of simplicity. The following description is based on the embodiment shown in FIG. 2.

Figure 4:
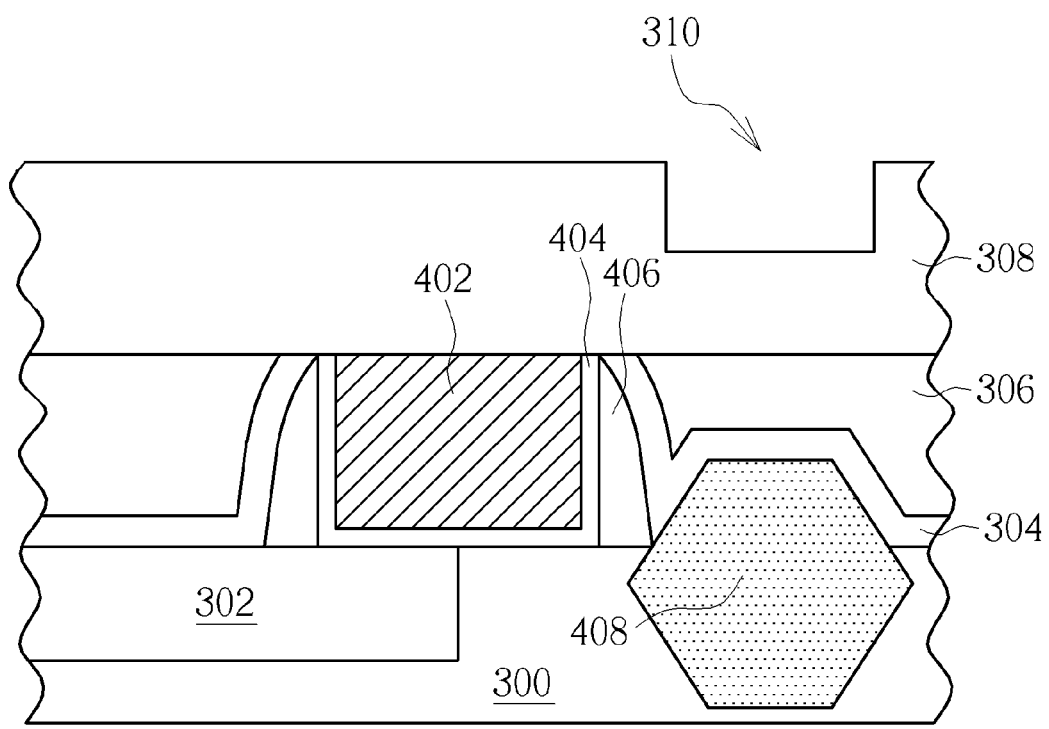

As shown in FIG. 4, after the formation of the transistor 400, a second ILD layer 308 is then formed on the first ILD layer 306. The material of the second ILD layer 308 can be the same or can be different from that of the first ILD layer 306. In one embodiment, the second ILD layer 308 can be formed by a chemical vapor deposition (CVD) process, a spin coating process, or other suitable process that can form any dielectric materials. Alternatively, according to the requirement of etching processes, the second ILD layer 308 can include a plurality of dielectric layers, each of which contains different etching selectivity. For example, the bottom layer is etched in a lower rate while the upper layer is etched in a higher rate such that the etching process can stop on the predetermined layer. After forming the second ILD layer 308, a trench 310 is formed in the second ILD layer 308 above the source/drain region 408 by a photo-etching-process (PEP).

Figure 5:
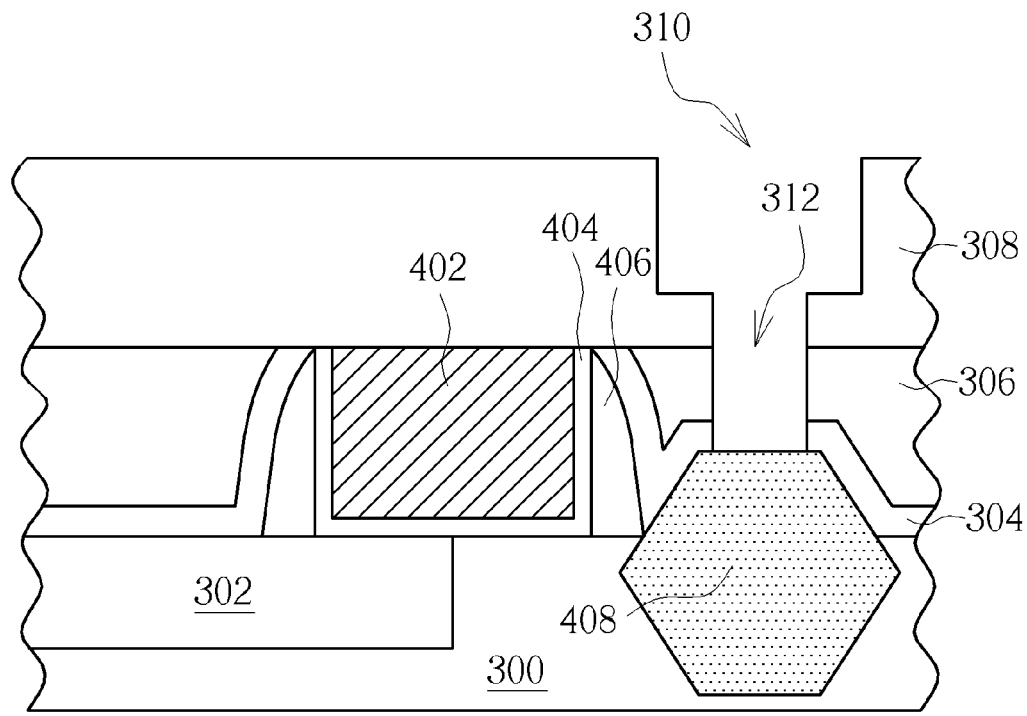

As shown in FIG. 5, a via 312 is formed under the trench 310 by another PEP to expose the source/drain region 408. Preferably, the width of the via 312 is less than that of the trench 310. It is noted that the bottom side of the trench 310 (that is, the boundary of the trench 310 and the via 312) is still located in the second ILD layer 308.

Figure 6:
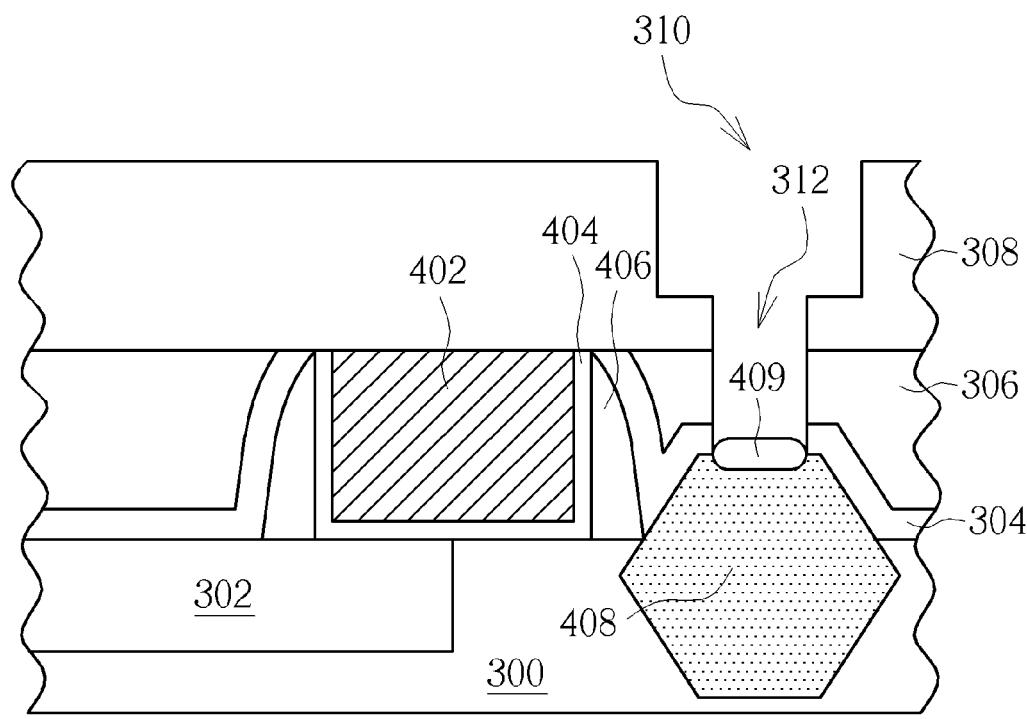

As shown in FIG. 6, a silicide layer 409 such as a NiSi layer is formed on the source/drain region 408 exposed by the via 312. In another embodiment of the present invention as shown in FIG. 3, since the silicide layer 409a has been formed on the source/drain region 408, the step of forming the silicide layer can be omitted.

As shown in FIG. 7, a first barrier layer 314 and a first metal layer 316 are sequentially filled into the trench 310 and the via 312, wherein the first barrier layer 314 is formed conformally along the surface of the trench 310 and the via 312, and the first metal layer 316 completely fills the trench 310 and the via 312. In one embodiment, the first barrier layer 314 can include Ti, TiN or TaN or a plurality of metal layers such as Ti/TiO, but is not limited thereto. The first metal layer 316 can include a variety of low-resistance metal materials, such as aluminum (Al), titanium (Ti), tantalum (Ta), tungsten (W), niobium (Nb), molybdenum (Mo), copper (Cu) or the like, preferably tungsten or copper, and most preferably tungsten, which can form suitable Ohmic contact between the first metal layer and the silicide layer 409 or the below source/drain region 408. Thereafter, a planarization step can be performed to make the first metal layer 316, the first barrier layer 314 and the second ILD layer 308 level with each other.

As shown in FIG. 8, a sacrificial layer 318 is formed on the second ILD layer 308, followed by forming an opening 320 in the sacrificial layer 318 and the second ILD layer 308 by another PEP to expose the gate 402 of transistor 400.

As shown in FIG. 9 and FIG. 10, a second barrier layer 322 and a second metal layer 324 are formed sequentially in the opening 320, wherein the second barrier layer 322 is formed conformal along the surface of the opening 320 and the second metal layer 324 completely fills the opening 320. In one embodiment, the second barrier layer 322 can include Ti, TiN or TaN or a plurality of metal layers such as Ti/TiO, but is not limited thereto. The second metal layer 324 can include a variety of low-resistance metal materials, such as aluminum (Al), titanium (Ti), tantalum (Ta), tungsten (W), niobium (Nb), molybdenum (Mo), copper (Cu) or the like, preferably tungsten or copper, and most preferably copper, which can reduce the resistance of the second metal layer 324. Finally, a planarization step is performed to remove all of the sacrifice layer 318, a part of the second barrier layer 322 and a part of the second metal layer 324, making the second metal layer 324 level with the second ILD layer 308. In another embodiment of present invention, the step of forming the sacrificial layer 318 can be omitted. After the first metal layer 316 and the first barrier layer 314 are planarized, the opening 320 is directly formed in the second ILD layer 308 and the second barrier layer 322 and the second metal layer 324 are filled into the opening 320 in the second ILD layer 308.

Through the aforementioned steps, a first contact plug 317 and a second contact plug 325 can be formed in the first ILD layer 306 and second ILD layer 308 (called metal 0). The first contact plug 317 is disposed in the first ILD layer 306 and the second ILD layer 308. The first contact plug 317 contains a first trench portion 317a and a first via portion 317b and electrically connects the source/drain region 408 by the silicide layer 409. The second contact plug 325 is disposed in the second ILD layer and electrically connects the gate 402.

In the following steps, a metal interconnect system (not shown), which includes a plurality of inter-metal dielectric (IMD) layers and a plurality of metal layers (so called metal 1, metal 2, and the like), can be further formed above the second ILD layer 308 by a conventional metal interconnection fabrication method, thereby providing a signal input/output pathway for the transistor 400.

It is one salient feature that the first contact plug 317 is formed by a "trench first" dual damascene process, that is, forming a trench 310 with larger width (FIG. 4), then forming a via 312 with smaller width (FIG. 5), and filling the via 312 and the trench 310 with the first barrier layer 314 and the first metal layer 316 (FIG. 7). Comparing with conventional arts which forms two contact plugs respectively in the first ILD layer 306 and the second ILD layer 308 in which each contact plug has its own barrier layer and metal layer, the present invention uses a dual damascene process to form the first contact plug 317 which contains one single first barrier layer 314 and one single first metal layer 316. The first barrier layer 314 is disposed on a surface of the first contact plug 317 and there is no barrier layer between the first trench portion 317a and the first via portion 317b. Consequently, the resistance of the first contact plug 317 can be reduced. In addition, the first contact plug 317 formed by the dual damascene process can have a "up-large-bottom-small" structure, which is constituted of a first trench portion 317a with a greater width and a first via portion 317b with a less width. Since the boundary of the first trench portion 317a and the first via portion 317b is located at the second ILD layer 307, a vertical distance h between the first trench portion 317a and the top surface 403 of the gate 402 is provided. Consequently, the short phenomenon between the first contact plug 317 and the gate 402 in conventional arts can be avoided, thereby upgrading the process window of the manufacturing processes. However, it is understood that the dual damascene process in FIG. 4 to FIG.

7 shows a "trench first" process, that is, forming the trench first and then forming the via. In another embodiment, the first contact plug 317 can be formed by other kinds of dual damascene process, such as a "via first" process which includes forming the via 308 first and then forming the trench 310 or a "partial-via-first" process.

Figure 11:
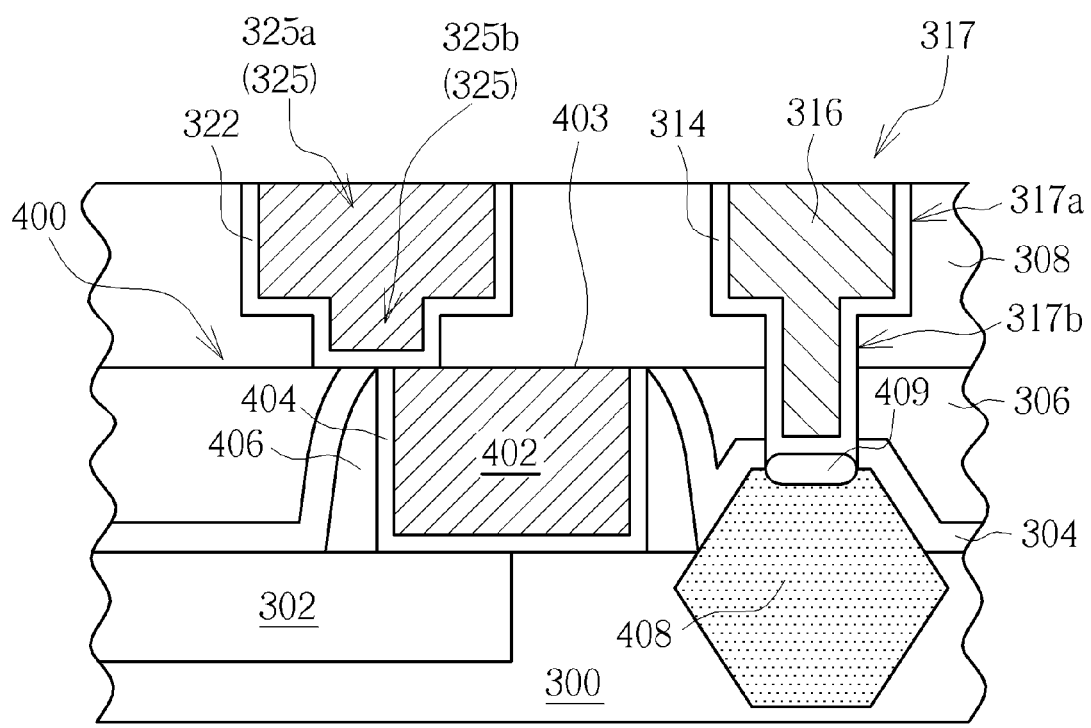

"The abovementioned embodiment shows that the first contact plug 317 which connects the source/drain region 408 of transistor 400 is formed (FIG. 5 to FIG. 7) before the second contact plug 325 which connects the gate 402 of the transistor 400 (FIG. 8 to FIG. 9), in another embodiment, the first contact plug 317 can be formed after the second contact plug 325. In another embodiment, the second contact plug 325 can be formed by a dual damascene process as well. As shown in FIG. 11, the second contact plug 325 has a second trench portion 325a and a second via portion 325b."

Since the first contact plug 317 and the second contact plug 325 are formed separately, the materials of the first barrier layer 314 and the first metal layer 316 (which constitute the first contact plug 317) can be the same, partially different or completely different from those of the second barrier layer 322 and the second metal layer 324 (which constitute the second contact plug 325).

As shown in FIG. 9, the present invention provides a semiconductor structure including a contact plug. The structure includes a substrate 300, a transistor 400, a first ILD layer 306, a second ILD layer 308, a first contact plug 317 and a second contact plug 325. The transistor 400 is disposed on the substrate 300 and includes a gate 402 and a source/drain region 408. The first ILD layer 306 is disposed on the transistor 400 and levels with a top surface 403 of the gate 402. The second ILD layer 308 is disposed on the first ILD layer 306. The first contact plug 317 is disposed in the first ILD layer 306 and the second ILD layer 308 and includes a first trench portion 317a and a first via portion 317b, wherein a boundary of the first trench portion 317a and a first via portion 317b is higher than the top surface 403 of the gate 402.

In summary, the present invention provides a semiconductor structure having at least a contact plug, and a method of making the same. By using the dual damascene process to form the first contact plug, it is advantageous that the short phenomenon between the first contact plug and the metal gate can be avoided, and the electrical performance can also be improved because only one single barrier layer is used in the first contact plug. In addition, the resistance value of the first contact plug and the second contact plug can also be reduced by using copper or tungsten as the material of metal layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure having at least a contact plug, comprise:
    a transistor disposed on a substrate, wherein the transistor comprises a gate and a source/drain region;
    a first inter-layer dielectric (ILD) layer disposed on the transistor and level with a top surface of the gate;
    a second ILD layer disposed on the first ILD layer; and
    a first contact plug disposed in and directly contacting both the first ILD layer and the second ILD layer, wherein the first contact plug comprises a first trench portion and a first via portion, a boundary of the first trench portion and the first via portion is higher than the top surface of the gate and located in the second ILD layer, and a portion of the second ILD layer is disposed between the boundary of the first trench portion and the first via portion and a top surface of the first ILD layer.

2. The semiconductor structure having at least a contact plug as in claim 1, wherein the first contact plug comprises a first barrier layer and a first metal layer, wherein the first barrier layer is disposed on a surface of the first trench portion and the first via portion.

3. The semiconductor structure having at least a contact plug as in claim 2, wherein the first metal layer comprises tungsten.

4. The semiconductor structure having at least a contact plug as in claim 1, wherein the first contact plug electrically connects the source/drain region of the transistor.

5. The semiconductor structure having at least a contact plug as in claim 4, wherein the transistor further comprises a silicide layer disposed between the first contact plug and the source/drain region.

6. The semiconductor structure having at least a contact plug as in claim 5, wherein the silicide layer corresponds to the first contact plug.

7. The semiconductor structure having at least a contact plug as in claim 1, further comprising a second contact plug disposed in the second ILD layer and electrically connected to the gate.

8. The semiconductor structure having at least a contact plug as in claim 7, wherein the second contact plug comprises a second trench portion and a second via portion.

9. The semiconductor structure having at least a contact plug as in claim 7, wherein the second contact plug comprises copper.

10. A method of forming a semiconductor structure having at least a contact plug, comprises:
    providing a substrate;
    forming a transistor and a first ILD layer on the substrate, wherein the first ILD layer is level with a top surface of a gate of the transistor to expose the gate;
    forming a second ILD layer on the first ILD layer; and
    after forming the second ILD layer, forming a first contact plug in the second ILD layer and the first ILD layer to electrically connect a source/drain region of the transistor, wherein the step of forming the first contact plug comprises a first dual damascene process, and a portion of the second ILD layer is disposed between the first contact plug and a top surface of the first ILD layer.

11. The method of forming a semiconductor structure having at least a contact plug as in claim 10, wherein the first dual damascene process comprises:
    forming a first trench;
    forming a first via; and
    filling the first trench and the first via with a first metal layer.

12. The method of forming a semiconductor structure having at least a contact plug as in claim 11, wherein the first metal layer comprises tungsten.

13. The method of forming a semiconductor structure having at least a contact plug as in claim 11, wherein the first trench is formed before the first via is formed.

14. The method of forming a semiconductor structure having at least a contact plug as in claim 11, wherein the first via is formed before the first trench is formed.

15. The method of forming a semiconductor structure having at least a contact plug as in claim 11, wherein the first via exposes the source/drain region of the transistor, and after forming the first via, a silicide layer is formed on the source/drain region exposed by the first via.

16. The method of forming a semiconductor structure having at least a contact plug as in claim 10, further comprising forming a second contact plug disposed in the second ILD layer to electrically connect the gate of the transistor.

17. The method of forming a semiconductor structure having at least a contact plug as in claim 16, wherein the first contact plug is formed before the second contact plug is formed.

18. The method of forming a semiconductor structure having at least a contact plug as in claim 16, wherein the first contact plug is formed after the second contact plug is formed.

19. The method of forming a semiconductor structure having at least a contact plug as in claim 16, wherein the step of forming the second contact plug comprises a second dual damascene process.

20. The method of forming a semiconductor structure having at least a contact plug as in claim 16, wherein the second contact plug comprises copper.

\* \* \* \* \*